United States Patent
Boitano

(10) Patent No.: US 9,412,181 B1
(45) Date of Patent: *Aug. 9, 2016

(54) SYSTEM AND METHOD FOR DIGITAL IMAGE INTENSITY CORRECTION

(71) Applicant: Fonar Corporation, Melville, NY (US)

(72) Inventor: Michael Boitano, Smithtown, NY (US)

(*) Notice: Subject to any disclaimer, the term of this patent is extended or adjusted under 35 U.S.C. 154(b) by 129 days.

This patent is subject to a terminal disclaimer.

(21) Appl. No.: 14/305,898

(22) Filed: Jun. 16, 2014

Related U.S. Application Data

(63) Continuation of application No. 13/540,126, filed on Jul. 2, 2012, now Pat. No. 8,755,601, which is a continuation of application No. 12/932,272, filed on Feb. 22, 2011, now Pat. No. 8,213,715, which is a continuation of application No. 11/656,565, filed on Jan. 23, 2007, now Pat. No. 7,894,668, which is a continuation of application No. 11/536,594, filed on Sep. 28, 2006, now abandoned.

(51) Int. Cl.
*G06K 9/00* (2006.01)
*G06T 7/40* (2006.01)
*G01R 33/56* (2006.01)

(52) U.S. Cl.
CPC ............. *G06T 7/408* (2013.01); *G01R 33/56* (2013.01)

(58) Field of Classification Search
None
See application file for complete search history.

(56) References Cited

U.S. PATENT DOCUMENTS

| | | | | |
|---|---|---|---|---|
| 7,860,167 B2 * | 12/2010 | Le Dinh | ................ | H04N 5/208 375/240.2 |
| 2006/0050783 A1 * | 3/2006 | Le Dinh | ................ | H04N 5/208 375/240.2 |
| 2010/0232697 A1 * | 9/2010 | Mishima | ............. | G06K 9/4647 382/168 |

FOREIGN PATENT DOCUMENTS

| | | | | | |
|---|---|---|---|---|---|
| CA | | 2616875 A1 * | 2/2006 | ............. | H04N 5/208 |
| CA | WO | 2006010276 A1 * | 2/2006 | ............. | H04N 5/208 |
| CA | EP | 1771818 A1 * | 4/2007 | ............. | H04N 5/208 |
| CA | EP | 1771818 A4 * | 7/2011 | ............. | H04N 5/208 |

* cited by examiner

Primary Examiner — Tsung-Yin Tsai
(74) Attorney, Agent, or Firm — Van Dyke Law; Raymond Van Dyke

(57) ABSTRACT

The present invention provides a method and apparatus to enhance the image contrast of a digital image device while simultaneously compensating for image intensity inhomogeneity, regardless of the source. The present invention corrects intensity inhomogeneities producing a more uniform image appearance. Also, the image is enhanced through increased contrast, e.g., tissue contrast in a medical image. The method makes no assumptions as to the source of the inhomogeneities, e.g., physical device characteristics or positioning of the object being imaged. In the method, the error between the histogram of the spatially-weighted original image and a specified histogram is minimized. The specified histogram may be selected to increase contrast generally or particularly for accentuation, e.g., on localized regions of interest. The weighting is preferably achieved by two-dimensional interpolation of a sparse grid of control points overlaying the image. A sparse grid is used rather than a dense one to compensate for slowly-varying image non-uniformity. Also, sparseness reduces the computational complexity, as the final weight set involves the solution of simultaneous linear equations whose number is the size of the chosen grid.

27 Claims, 10 Drawing Sheets

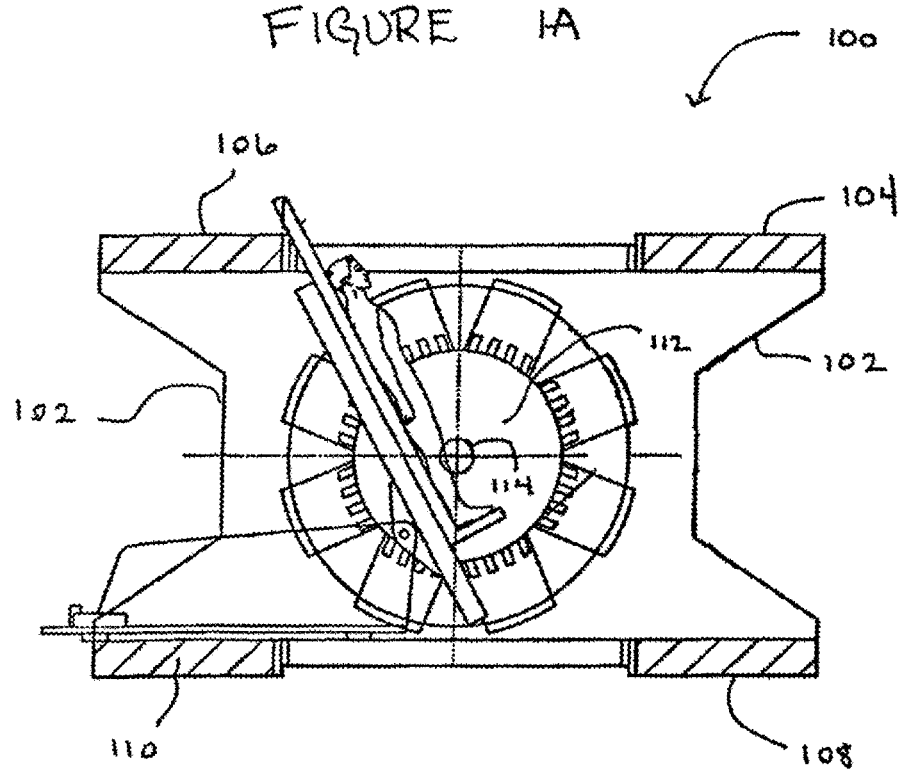

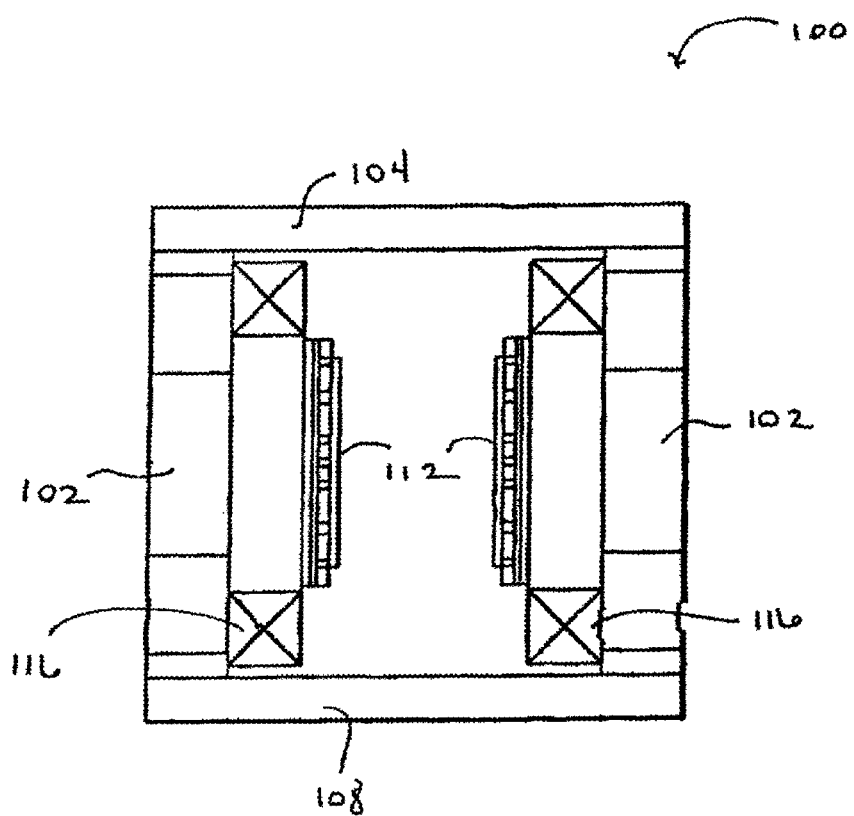

SYSTEM AND METHOD FOR DIGITAL IMAGE INTENSITY CORRECTION

This application is a continuation application and claims the benefit of U.S. patent application Ser. No. 13/540,126, filed Jul. 2, 2012, now U.S. Pat. No. 8,755,601, which is a continuation application of U.S. patent application Ser. No. 12/932,272, filed Feb. 22, 2011, now U.S. Pat. No. 8,213,715, which is a continuation application of U.S. Ser. No. 11/656,565, filed Jan. 23, 2007, now U.S. Pat. No. 7,894,668, which is a continuation application from U.S. Ser. No. 11/536,594, filed Sep. 28, 2006, abandoned, the contents of which are incorporated herein by reference.

BACKGROUND OF THE PRESENT INVENTION

1. Technical Field

The technical field generally relates to digital imaging and more specifically to a method for improving the image contrast of a digital image.

2. Background

With the rise of digital imagery, the usage of digital imaging techniques has spread to almost all scientific, corporate and numerous other endeavors. The usage of imaging and the improvements thereon can be more important in some industries, e.g., life sciences, and most important in others, e.g., medical and dental imaging. Physicians and surgeons, for example, have begun to rely on digital imagery over conventional techniques, and the rise of computers and digitization have accelerated the paradigm shift to the new medium. Naturally, improvements in the quality of digital images have been felt in the consumer industries, e.g., sales of improved digital cameras and tools to visualize images, and in numerous commercial applications.

As digital imaging surpasses and supplants all other forms of medical and other imaging, e.g., use of film and chemical processes, improvements in the quality of digital images will be key. In the medical and dental areas, for example, a variety of imaging techniques have been and are currently employed to best capture the detail of the human body tissue, permitting those skilled in interpreting these images to diagnose various illnesses, e.g., cancer, from a subtle shade in the image. Inhomogeneities in the image intensity can even compromise diagnosis and cause delays in treatment, demonstrating the importance of the need for improvements in imaging techniques. Of course, image intensity inhomogeneities cause multiple other problems in non-medical areas requiring image interpretation or fine resolution, e.g., photography.

Although the contemplated imaging improvement techniques of the instant invention are applicable to all images having intensity inhomogeneities therein, Applicant will describe in detail technologies where the improvements in imaging are quite critical, e.g., medical diagnosis. Specific improvements in correcting digital image intensity inhomogeneities are also set forth in Applicant's co-pending application, U.S. patent application Ser. No. 11/452,415, filed Jun. 14, 2006, incorporated by reference herein. Although a focus of the present application herein is medical imaging, the principles of the instant invention are applicable to all digital imaging, particularly where image intensity inhomogeneities are present.

For example, magnetic resonance (MR) imaging techniques employ receivers and computers to gather, process and display the data collected. As is well understood in the MR art, in MR imaging or MRI, atomic nuclei in a sample are exposed to magnetic fields, and variations in atomic responses are detected, positions calculated and effects visualized for medical diagnosis. The numerous advantages of MRI and technical details thereof are found in various issued patents obtained by Applicant's assignee.

The problems associated with MRI image intensity inhomogeneity are well known. Images that exhibit this phenomenon show gradual, low frequency spatial variation in intensity within the localized regions of anatomy or other areas of interest. The sources of the problem in MRI imaging include various component parts of an MR device, such as the receiver coil, transmitter coil and magnetic field variations, uncompensated eddy currents, and patient positioning. Display presentation and automatic computer analysis, including tissue segmentation and classification, become problematic with such images. In other arts, the sources of image intensity inhomogeneities will differ, e.g., glare from the sun or other light source, but the principles of the present application, as claimed, apply in the same or similar fashion.

As is understood in the MRI art, the receiver coil may be the primary contributor to intensity variations. The spatial variation of the coil field produces images that have strong signal intensities near the coil surface and decreased intensity distant from the coil. Both conventional circumferential coils and, particularly, surface coil arrays may exhibit this problem. It should, of course, be understood that in other technological usages image intensity variations can be introduced into images from a variety of sources, requiring a technique to adapt to and correct such variations.

A simple mathematical model of a digital image, e.g., the measured MR image, is given by the following equation:

$$R(x,y)=F(x,y) \cdot I(x,y)$$

where $R(x,y)$ is the received image, $F(x,y)$ is the multiplicative, inhomogeneous coil field, and $I(x,y)$ is the unadulterated true image data. In this model random noise is ignored. If the coil field were known, the received image could be modified by $F^{-1}(x,y)$ producing a more uniform true image. Numerous methods to estimate the receiver coil field have been proposed. One group or class of solutions involves knowledge of the coil geometry and electrical characteristics, allowing analytic field modeling using the Biot-Savart law. These methods, however, require knowledge of the patient position and size of the receiver coil and do not account for changing coil characteristics. Also, the flexible nature of coil arrays is problematic. Another class utilizes additional measurements on a uniform phantom to map the coil field. The requirement for identical patient and phantom scanning parameters make these techniques impractical. Other techniques use low resolution images acquired at the time of the patient scan to estimate the coil field, thus increasing the scan time. Post-processing or retrospective methods have been proposed also. Some require manual intervention to achieve good results, which is not desirable. Some assume that a low pass filtered version of the image is a good approximation to the coil field, which is not the case in high contrast areas of images.

It should, of course, be understood that $F(x,y)$ in other technological areas represents other multiplicative, inhomogeneous sources of data variation. A number of other post-processing techniques use image content to generate an estimate of the distortion. Thus, a system, device and method are desired that compensate for image intensity inhomogeneity regardless of the source while simultaneously enhancing the image contrast.

Although the imaging arts, whether medical or other, are quite sophisticated, image intensity inhomogeneities and other such artifacts continue to haunt the digital imaging field. Although the need for quality imaging is more pronounced in medicine, the principles set forth in the present invention, representing a significant advance in digital imaging per se, are applicable to all uses of digital imaging.

SUMMARY

The present invention provides a method, apparatus and system to enhance the image contrast of a digital image device while simultaneously compensating for image intensity inhomogeneity, regardless of the source. The present invention corrects intensity inhomogeneities producing a more uniform image appearance. Also, the image is enhanced through increased contrast, e.g., tissue contrast in a medical image. The present invention makes no assumptions as to the source of the inhomogeneities, e.g., physical device characteristics or positioning of the object being imaged. In the method, the error between the histogram of the spatially-weighted original image and a specified histogram is minimized. The specified histogram may be selected to increase contrast generally or particularly for accentuation, e.g., on localized regions of interest. The weighting is preferably achieved by two-dimensional interpolation of a sparse grid of control points overlaying the image. A sparse grid is used rather than a dense one to compensate for slowly-varying image non-uniformity. Also, sparseness reduces the computational complexity, as the final weight set involves the solution of simultaneous linear equations whose number is the size of the chosen grid.

BRIEF DESCRIPTION OF THE DRAWINGS

The features, aspects, and advantages of the present invention will become better understood with regard to the following description, appended claims, and accompanying drawings where:

FIGS. 1A and 1B generally illustrate an MRI apparatus, exemplary of a system where image intensity inhomogeneities are present;

DETAILED DESCRIPTION OF THE INVENTION

Figure 2:
FIG. 2 illustrates a sagittal lumbar spine T1 fast spin echo image with intensity variations.

The following detailed description is presented to enable any person skilled in the art to make and use the invention. For purposes of explanation, specific nomenclature is set forth to provide a thorough understanding of the present invention. However, it will be apparent to one skilled in the art that these specific details are not required to practice the invention. Descriptions of specific applications are provided only as representative examples. Various modifications to the preferred embodiments will be readily apparent to one skilled in the art, and the general principles defined herein may be applied to other embodiments and applications without departing from the scope of the invention. The present invention is not intended to be limited to the embodiments shown, but is to be accorded the widest possible scope consistent with the principles and features disclosed herein.

The present invention is an imaging method, apparatus and system that transforms the original pixel values of an image so that the resulting image histogram approximates a specified histogram with certain spatial constraints. Histogram modification has been used as an image enhancement technique for some time. By modifying the histogram as described below, however, the method of the present invention compensates for image intensity inhomogeneity regardless of the source, while simultaneously enhancing the image contrast. The present invention will be described in more detail hereinbelow with particular reference to a specific medical device employing imaging, i.e., a magnetic resonance imaging (MRI) device.

It should, of course, be understood that although the present description describes MRI applications of the principles of the present invention in some detail, it is understood by those of skill in the digital imaging arts that the principles and teachings of the present invention are applicable to numerous other industries and software imaging applications, whether medical, dental or other life sciences applications. Indeed, the problems of correcting image intensity inhomogeneities plague all industries reliant on images, digital and otherwise, the medical diagnostic area being a more critical one.

With the above in mind, an exemplary MRI apparatus which employs and illustrates the principles of the present invention is shown in FIGS. 1A and 1B of the Drawings. In an open MRI, generally represented by the reference numeral 100 in FIGS. 1A and 1B, a magnet structure includes a pair of vertically extending sidewalls 102 and an upper flux return structure, including a pair of flux return members 104 and 106 extending between sidewalls 102. The lower flux return structure includes a similar pair of flux return members 108 and 110. A pair of round, generally cylindrical ferromagnetic poles 112 project inwardly from the opposed sidewalls 102 along a magnet axis or pole axis 114. A flux source is also provided, in this example including coils 116, illustrated in FIG. 1B, which may be resistive or super-conducting coils surrounding the poles or may be permanent magnet material, as is understood in the art. In a possible variant, the upper and lower flux return members, 104, 106, 108 and 110 may not necessarily include pairs, as is described hereinabove. In particular the upper and lower flux return members may include a single member that is positioned and sized to provide an adequate flux return path.

A more detailed description of the exemplary MRI apparatus may be found in commonly-owned U.S. Pat. No. 6,828,792, which is incorporated by reference herein, as well as the aforementioned and commonly-owned U.S. patent application Ser. No. 11/452,415, filed Jun. 14, 2006, also incorporated herein by reference. As discussed, the principles of the present innovation are just as applicable for any imaging device and technique where image intensity inhomogeneity is a problem.

Figure 3:
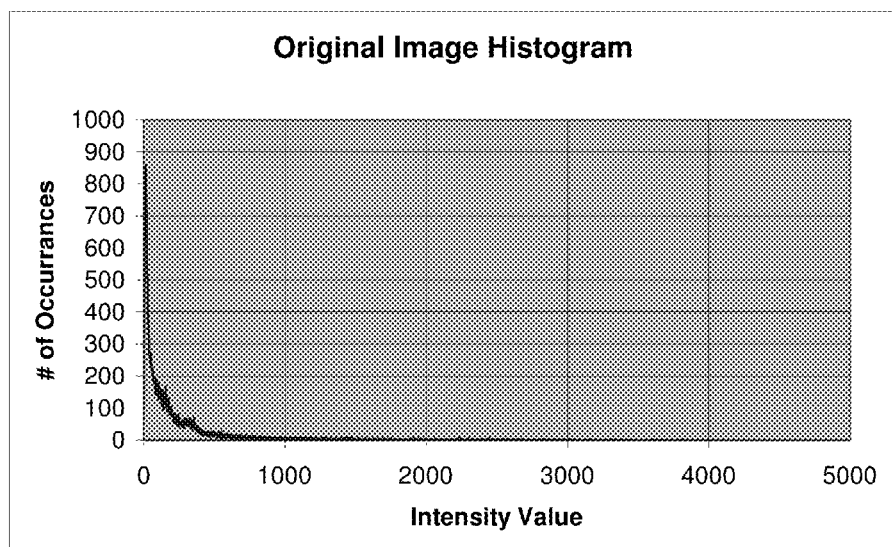
FIG. 3 shows a histogram for the image of FIG. 2.

In an MR image, for example, intensity inhomogeneity decreases image contrast, thereby making presentation problematic regardless of contrast and brightness settings. An example of an image with undesirable intensity variations is shown in FIG. 2. The image of FIG. 2 is from an MRI apparatus, such as that of FIGS. 1A and 1B, and shows a sagittal lumbar spine T1 fast spin echo image. Areas of the image near the receiver coil are extremely bright with intensity decreasing with anterior distance. The histogram of this image is shown in FIG. 3. The dominance of the dark pixel areas is noted with the great majority of pixels below intensity values of 1000.

Figure 4:
FIG. 4 illustrates a uniform histogram equalized image of the image of FIG. 2.
Figure 5:
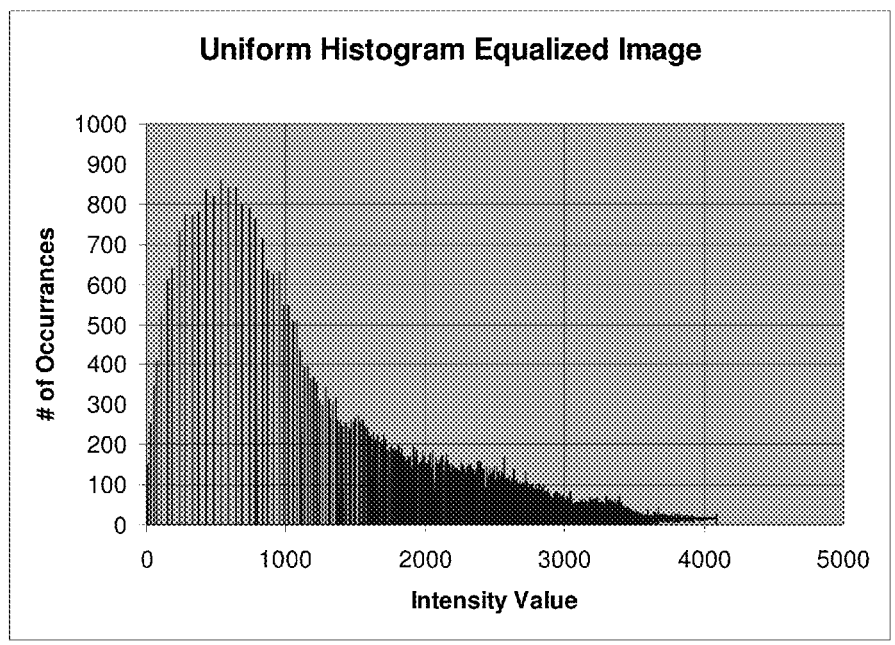
FIG. 5 shows a uniform histogram for the image of FIG. 4, weighted to brighter values.

After processing the image according to traditional uniform histogram equalization, the image is more uniform in intensity, but still somewhat difficult to analyze, as is shown in FIG. 4. The modified histogram of this image is shown in FIG. 5. As can be seen from FIGS. 4 and 5, the histogram is more uniformly distributed and the resulting image is more uniform in appearance, albeit not demonstrably better than the original.

In the traditional method of direct histogram specification, the histogram is modified in a manner that depends solely on the global properties of the image, i.e., the histogram. This traditional technique transforms the image histogram to a specified histogram without regard to local image content. Two distinct images with identical histograms will, therefore, generate the same transformation.

Although this is a standard method of image enhancement, it is not entirely appropriate for the aforedescribed image intensity inhomogeneity intensity problem. A "dark" pixel in the relatively bright portion of an MR or other digital image should not be transformed in the same way as a "dark" pixel in an area of decreased intensity. To remedy this problem, the present invention introduces the effects of the slowly-varying intensity inhomogeneity into the generation of individual pixel transformations.

Before correction, near the surface of the receiver coil 116 of an MRI device, image intensity is bright, while image intensity drops off moving away from the coil. When corrected using the correction technique of the present invention, the intensity near the coil is decreased while the intensity away from the coil is increased. This technique makes the image intensity more uniform, and decreases image contrast globally, but increases contrast within localized regions of anatomy or other areas of interest. Following correction, images of the spine and images of tissue regions with fat have greater contrast and with the cerebellum more detail, e.g., where the head is close to the coil. Prior to correction, areas with high intensity, such as subcutaneous fat, bright areas near the skin, and bright areas such as the brain near the coil, distort or compromise the image and make diagnosis difficult. After processing, the global image contrast is decreased, and the intensity of the fat values is decreased, but dark areas in fat are increased and contrast within localized regions of anatomy is increased. Similarly, in other imaging contexts, manipulation of the image contrast pursuant to the teachings of the present invention will smooth out image intensity inhomogeneities and improve overall image contrast.

In the present invention, a specified histogram distribution is selected to enhance the image in some way. Uniform or linearly-rising histograms have been used to increase the contrast in dark image areas, but any other shape may be used. A transformation is then applied to the original image gray levels modifying them to have the specified histogram. These are the reference pixel set. A sparse rectangular grid of control points is then overlaid on the image. This grid represents the location of a group of interpolating functions that influence each pixel's final value depending on the Euclidean distance of the pixel from the control or grid point. A sparse grid is chosen rather than a dense one to compensate for the slowly varying image intensity inhomogeneity. A dense grid would introduce the capability to correct for high frequency changes in image intensity, which is not necessarily desirable.

The method of the present invention computes a set of weights that scale the amplitudes of the interpolating functions. The weights are computed in such a way as to minimize the sum of the squared errors between the histogram-transformed pixel value and the weighted pixel value. Grid sparseness reduces the computational complexity as the final weight set involves the solution of simultaneous linear equations whose number is the size of the chosen grid. As indicated, particular histograms may be employed for desired effect. For example, a specified histogram may include a tissue contrast enhancement histogram, e.g., bathtub-shaped to enhance images where there are predominantly two ranges of interesting intensities, light and dark representing two distinct tissues. A tissue accentuation histogram could be a rectangular histogram centered in the mid-gray levels meant to subdue both light and dark pixels outside the tissue of interest thereby enhancing intra-tissue contrast. Similarly, a linearly-rising histogram may be employed, as well as combinations of the aforementioned histograms to achieve a variety of effects.

The global histogram specification transformation is computed in the conventional manner:

$$s_n = T(G_n)$$

where n is the gray level index, $s_n$ is the gray level result after transforming gray level value $G_n$, and $T(\cdot)$ is the histogram-specified transformation.

The square of the total image error is given by:

$$\varepsilon^2 = \sum_{i=1}^{N} \varepsilon_i^2 = \sum_{i=1}^{N} (s_i - s_i')^2$$

where $\epsilon_i^2$ is the squared error associated with the $i^{th}$ pixel, N is the number of pixels in the image, and $s_i$ is the histogram-specified transformed gray level of the $i^{th}$ pixel. The term $s_i'$ is the resulting gray level of the $i^{th}$ pixel due to the total contribution of the interpolated weighting grid. Thus, $$s_i' = P_i \sum_{j=1}^{M} b_{ji} W_j$$

where $P_i$ is the original gray level of the $i^{th}$ pixel, $b_{ji}$ is the interpolation coefficient of the $j^{th}$ grid point acting on the $i^{th}$ pixel, $W_j$ is the weight value of the $j^{th}$ interpolating function, i.e., grid point, and M is the number of points in the grid. That is, the new gray level value of the $i^{th}$ pixel is the old gray value times the sum of the M interpolation function contributions. Two-dimensional interpolation functions have been studied, and multiquadratic basis functions are preferably chosen for their smoothness and accuracy. In that case, the equation used is $b_{ji} = \sqrt{(d_{ji}^2 + r^2)}$, where r is an adjustable parameter, and $d_{ji}$ is the Euclidean distance from the $j^{th}$ grid point to the $i^{th}$ pixel. Other functions such as $b_{ji} = d_{ji}^2 \log d_{j1}$ or two-dimensional Gaussian functions may be used for simplicity.

The total squared error then becomes:

$$\varepsilon^2 = \sum_{i=1}^{N} \left[ s_i - P_i \sum_{j=1}^{M} b_{ji} W_j \right]^2$$

Taking the partial derivative with respect to the weights and equating to zero minimizes the error, yielding:

$$\frac{\partial \varepsilon^2}{\partial W_k} = 2 \sum_{i=1}^{N} \left[ s_i - P_i \sum_{j=1}^{M} b_{ji} W_j \right] \cdot [-P_i b_{ki}] = 0$$

$$\sum_{i=1}^{N} P_i^2 b_{ki} \sum_{j=1}^{M} b_{ji} W_j = \sum_{i=1}^{N} s_i P_i b_{ki}$$

This may be rewritten in matrix form as $$\begin{bmatrix} \sum_{i=1}^{N} P_i^2 b_{1i}^2 & \sum_{i=1}^{N} P_i^2 b_{1i} b_{2i} & \cdots & \sum_{i=1}^{N} P_i^2 b_{1i} b_{Mi} \\ \sum_{i=1}^{N} P_i^2 b_{1i} b_{2i} & \sum_{i=1}^{N} P_i^2 b_{2i}^2 & \cdots & \sum_{i=1}^{N} P_i^2 b_{2i} b_{Mi} \\ \vdots & \vdots & & \vdots \\ \sum_{i=1}^{N} P_i^2 b_{Mi} b_{1i} & \sum_{i=1}^{N} P_i^2 b_{Mi} b_{2i} & \cdots & \sum_{i=1}^{N} P_i^2 b_{Mi}^2 \end{bmatrix} \begin{bmatrix} W_1 \\ W_2 \\ \vdots \\ W_M \end{bmatrix} = \begin{bmatrix} \sum_{i=1}^{N} s_i P_i b_{1i} \\ \sum_{i=1}^{N} s_i P_i b_{2i} \\ \vdots \\ \sum_{i=1}^{N} s_i P_i b_{Mi} \end{bmatrix}$$

$BW = Z$

B is a symmetric and positive definite matrix and the set of weights can now be solved by the inversion of B.

$W = B^{-1} Z$

Figure 6:
FIG. 6 illustrates an image processed according to the present invention.
Figure 7:
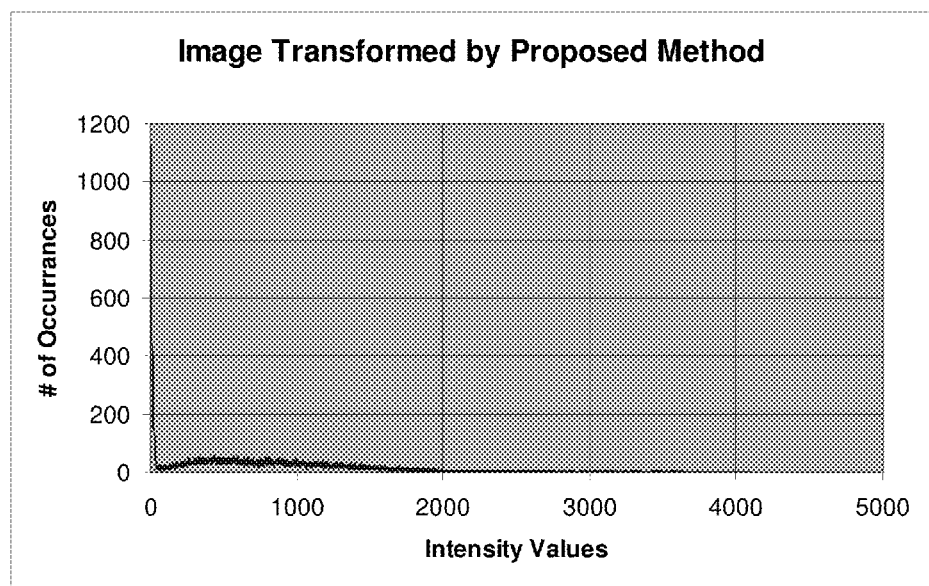
FIG. 7 shows a histogram, according to the present invention, for the image of FIG. 6.

The image of FIG. 2 was processed with the technique described hereinabove and the resulting image is shown in FIG. 6. As is evident from the modified figure, the image has been transformed to a more uniform intensity. Unlike the traditional histogram equalization technique, the method of the present invention considers a pixel's location when performing modification. The resulting histogram is shown in FIG. 7. The histogram still shows a large number of pixels near zero intensity, representing those in the image outside the anatomy. However, there has been a shift in anatomy pixels toward brighter values.

The image of FIG. 7 was processed using two-dimensional Gaussian weighting functions centered on a 4×4 grid. That is, 16 grid points were chosen to overlay the original image information of FIG. 2. At each grid point, the interpolation function or weighting function used was a two-dimensional Gaussian function. Alternatively, for a 3D MR image, the interpolation function or weighting function used at each 3D grid point could be a three-dimensional Gaussian function. Each weighting function at each grid point varies in amplitude, thereby correcting the original image for intensity inhomogeneities.

Figure 8:
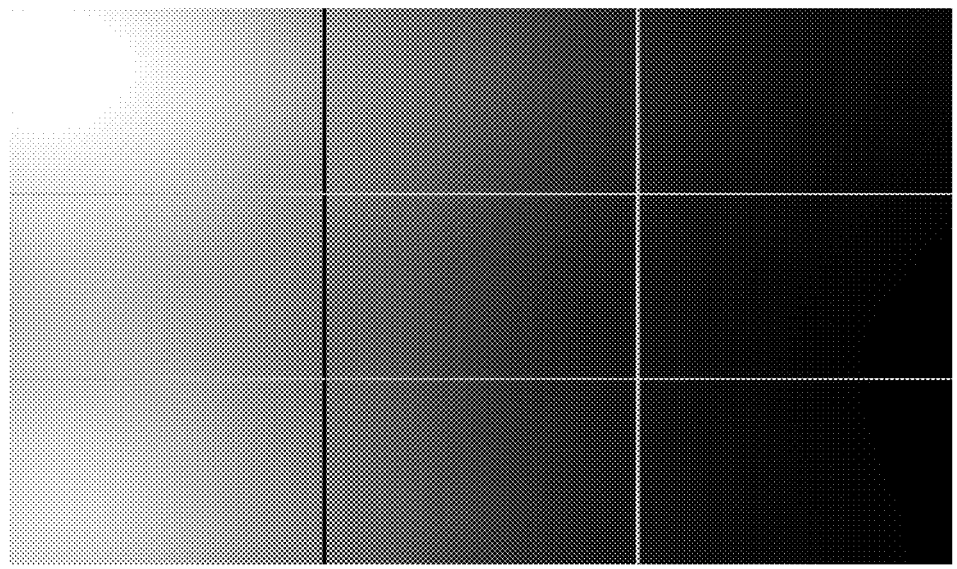
FIG. 8 shows the weighting function surface of the present invention.

The total weight contribution to the image of these functions is shown in FIG. 8. The brighter intensity areas represent the higher weighting values. The weighting surface appears to be the inverse of the coil intensity profile in the original image. The weighting functions are centered at the intersection of the gridlines, i.e., the intersections of horizontal and vertical lines connecting the 16 grid points, along the image perimeter as well as with each other.

The method described hereinabove corrects intensity inhomogeneities producing a more uniform image appearance. Also, the image is enhanced through increased contrasting, e.g., tissue contrast. The method makes no assumptions as to the source of the inhomogeneities, e.g., physical coil characteristics or patient placement in medical applications or object positioning in other applications. In the method of the present invention, the error between the histogram of the spatially-weighted original image and a specified histogram is minimized. The specified histogram may be selected to increase contrast generally or to accentuate a particular image type or class, e.g., in MRI a particular localized region of anatomy or other area of interest. The weighting is achieved by two-dimensional interpolation of a sparse grid of control points overlaying the image. The sparse grid is used rather than a dense one to compensate for the slowly-varying image non-uniformity. Also, sparseness reduces the computational complexity as the final weight set involves the solution of simultaneous linear equations whose number is the size of the chosen grid.

Figure 9:
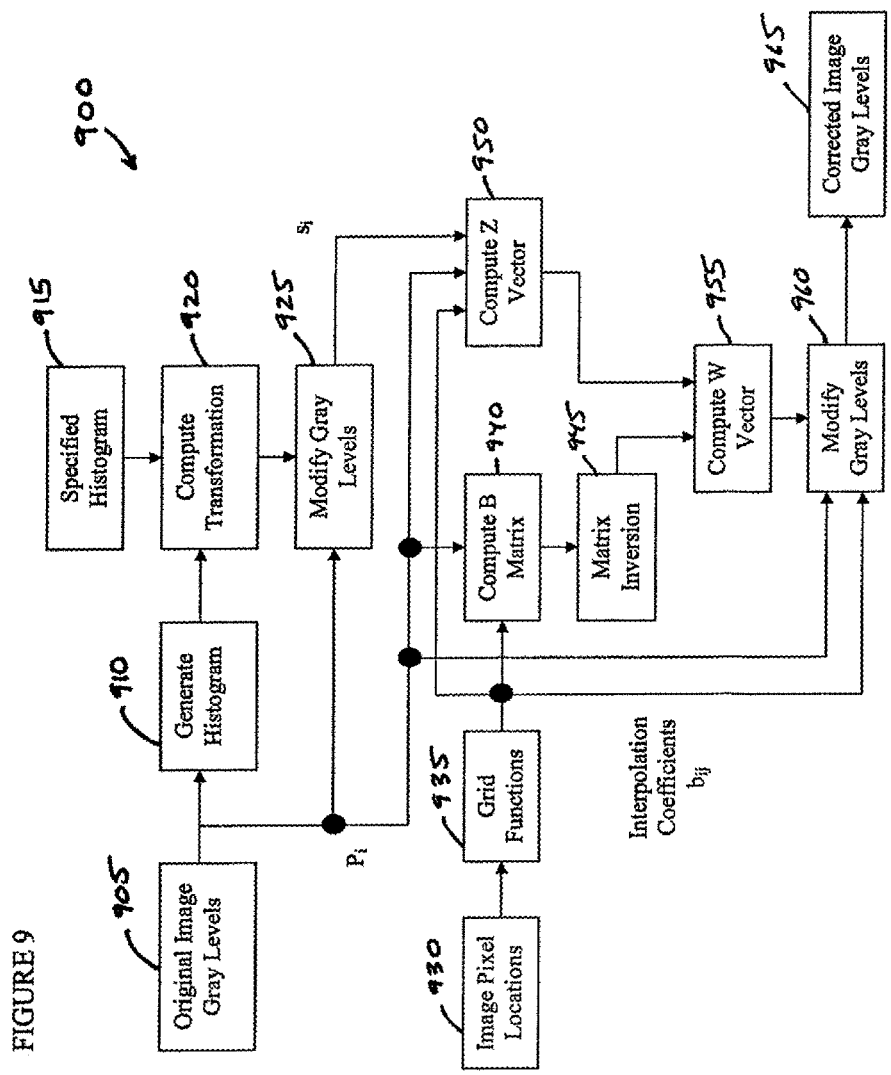
FIG. 9 illustrates a flow chart of steps employed in implementing an embodiment of the present invention.

With reference now to FIG. 9 of the Drawings, there is shown a flowchart, designated generally by the reference numeral 900, illustrating various steps that may be performed in implementing the present invention. In FIG. 9, original image gray levels, i.e., the raw image data or $P_i$, designated by the reference numeral 905, such as shown hereinabove in FIG. 2, are used to generate an original image histogram 910, such as shown in FIG. 3. Also shown in FIG. 9 is a specified histogram 915, e.g., the aforementioned uniform, linearly-rising or other histograms. A transformation 920 is then applied to the original gray levels 905, using the original image histogram 910, modifying the levels to have the specified histogram 915, resulting in modified image gray levels 925.

Also shown in flowchart 900 of FIG. 9 are image pixel locations, designated by the reference number 930, which correlate to the aforedescribed grid, particularly a sparse rectangular grid of control points, overlaid on the image. As described hereinabove, the grid incorporates interpolation functions, designated generally by the reference numeral 935, which are used in the matrix calculations.

The original image gray levels ($P_i$) 905 and the grid functions 935 are used to compute the aforedescribed B matrix, designated by the reference numeral 940, which is then inverted 945. The original image gray levels 905, grid interpolation coefficients/functions 935 and the modified or transformed image gray levels 925 are employed to compute the aforementioned Z vector, designated by reference numeral 950. The inverted B matrix 945 and Z vector 950 are then used to compute the weight vector W, designated by reference numeral 955, as per the aforedescribed formula:

$W = B^{-1} Z$

The original image gray levels 905, the grid functions 935 and the weight vector (W) 955 are then employed to modify the original data, the modification operation being designated by reference numeral 960, thus producing output-corrected image gray levels 965, pursuant to the teachings of the present invention. The resultant image, adjusted per the steps of FIG. 9, offsets and corrects the aforementioned intensity inhomogeneities in the original pixel information, providing significant enhancements in the field of digital imaging, and providing healthcare and MRI treatment professionals with a better diagnostic tool for interpreting MRI imagery or any digitally-produced imagery.

Additional applications of the present invention in the medical arena include endoscopic viewing, where an endoscope is inserted into the body with a camera and source of illumination at the leading end. The images produced by this approach may be non-uniform in intensity, e.g., with the edges of the image darker than the center. The techniques of the present invention can be applied to such images, correcting the non-uniformities therein, providing greater contrast for image interpretation, and facilitating diagnoses. An additional application is in the area of ultrasound imaging, where the principles of the present invention would be applicable.

As discussed, the principles and techniques of the present invention are applicable to all digital imaging situations where the digital image has intensity inhomogeneities therein, regardless of the source of the introduced error. The numerical correction techniques of the instant invention, as well as apparatus implementing them, are therefore quite useful for a large variety of industries beyond medical and dental.

In the consumer sector, the dramatic rise in digital cameras and the supplantation of the traditional chemical film industry, whether in still pictures or video, has been a revolution, the speed of which is increasing. Despite the rapid rate and numerous advances in the digital arena, however, several problems from the analog world remain, as well as new problems being encountered. The principles of the present invention are adaptable to correct the imaging intensity inhomogeneity issues arising in this new consumer products market.

For example, digital cameras have a flash adapter for use in low illumination environments. In wide angle or landscape modes, the sides of the image are considerably darker than the center portion, with detail falling off along the sides with the lack of contrast. The principles of the present invention, set forth hereinabove, are applicable and helpful in processing these digital images. Illumination correction, for example, can be done at a photo processing shop, or editing using computer application software. Alternatively, the algorithms and techniques can be incorporated directly into the camera itself, allowing immediate post-processing or automatic correcting of images containing intensity inhomogeneities and contrast problems therein.

The weighing and sparse grid features of the present invention can also be useful in other situations where digital cameras would be employed to preserve the moment in difficult lighting environments. For example, at large concerts such as in stadiums, the stage is illuminated but everything else is considerably darker, especially at night or in darkened arenas. In night imaging, and other areas of image intensity inhomogeneity, the camera will automatically correct the image by averaging the values of the pixels. However, when the average intensity is less than the subject area, the camera increases the exposure, washing out the subject. Thus, with existing digital imaging techniques, the image pixels are averaged and considerable detail is lost. Utilization of the improvements set forth in the present invention, providing an improved analysis and correction of local distortions, will ameliorate the image inconsistencies and allow better preservation of significant moments in peoples' lives, whether close up to a brightly-lit stage or far therefrom.

As indicated, the intensity of the sun can create serious image distortion, which is correctible using the principles of the present invention. Another application of the imaging corrective feature of the present invention is in the field of satellite imaging and topographic analysis. Here, as in medical imaging, fine details as to terrain can be of great importance, e.g., in municipal planning, governmental studies, and, of course, to the military and surveillance agencies. Extracting information from images, whether from the air or satellite, and gleaning intelligence therefrom, is of great use to select individuals and organizations.

Although the principles of the present application are described primarily in the context of still imagery, e.g., an MRI or a digital photo, the techniques of the present invention are also applicable to video and motion picture films. As indicated, the images in the frames or discrete units of a movie can be cleaned up in post-processing, or, with adequate computational capacity, corrected on-the-fly. It should, of course, be understood that the techniques of the present invention can be adapted in such applications to take advantage of a number of similar adjacent image frames, providing a greater sample for measurements and corrective actions. For example, the same or similar corrective actions taken in one frame can be applied in another.

Additionally, in the conversion of analog images to digital, there is a chance that inhomogeneities within the analog medium, e.g., film, may transfer to the digital realm. These irregularities may be detectable prior to processing, allowing the corrective techniques of the present invention to ameliorate or eliminate the artifacts. Of course, once converted to digital, the principles of the present invention, set forth in detail hereinabove, are then readily applicable.

An additional benefit of the instant invention is that the algorithms employed on an image only correct intensity or other inhomogeneities present. If the native image has no such inhomogeneities present, the principles of the present application do not then cause harm or otherwise compromise that image.

The foregoing description of the present invention provides illustration and description, but is not intended to be exhaustive or to limit the invention to the precise one disclosed. Modifications and variations are possible consistent with the above teachings or may be acquired from practice of the invention. Thus, it is noted that the scope of the invention is defined by the claims and their equivalents.

What is claimed is:

1. A method for correcting a digital image, said method comprising:
   receiving pixel information for an image of an object; and
   transforming, using a processor, at least one pixel in said pixel information by minimizing error between a histogram of said pixel information and a specified histogram.

2. The method according to claim 1, wherein said step of transforming comprises:
   modifying said pixel information;
   computing a weighting vector by minimizing the error between said histogram and said specified histogram; and
   correcting said pixel information using said weighting vector.

3. The method according to claim 2, wherein said weighting vector (W) is described by the formula:

$$W = B^{-1} Z.$$

4. The method according to claim 3, wherein matrix B and vector Z are described by the formulas:

$$B = \begin{bmatrix} \sum_{i=1}^{N} P_i^2 b_{1i}^2 & \sum_{i=1}^{N} P_i^2 b_{1i} b_{2i} & \cdots & \sum_{i=1}^{N} P_i^2 b_{1i} b_{Mi} \\ \sum_{i=1}^{N} P_i^2 b_{1i} b_{2i} & \sum_{i=1}^{N} P_i^2 b_{2i}^2 & \cdots & \sum_{i=1}^{N} P_i^2 b_{2i} b_{Mi} \\ \vdots & \vdots & & \vdots \\ \sum_{i=1}^{N} P_i^2 b_{Mi} b_{1i} & \sum_{i=1}^{N} P_i^2 b_{Mi} b_{2i} & \cdots & \sum_{i=1}^{N} P_i^2 b_{Mi}^2 \end{bmatrix}$$

and $$Z = \begin{bmatrix} \sum_{i=1}^{N} s_i P_i b_{1i} \\ \sum_{i=1}^{N} s_i P_i b_{2i} \\ \vdots \\ \sum_{i=1}^{N} s_i P_i b_{Mi} \end{bmatrix}$$

where $s_i$ is the histogram specified transformed gray level of the $i^{th}$ pixel, N is the number of pixels in the image, $P_i$ is the original gray level of the $i^{th}$ pixel, $b_{ji}$ is the interpolation coefficient of the $j^{th}$ grid point acting on the $i^{th}$ pixel, $W_j$ is the weight value of the $j^{th}$ interpolating function, and M is the number of points in the grid.

5. The method according to claim 1, wherein a plurality of grid points overlay said image of said object, each said grid point having associated therewith at least one interpolating function.

6. The method according to claim 5, wherein said at least one interpolating function is selected from the group consisting of:
Gaussian functions and multiquadratic basis functions.

7. The method according to claim 6, wherein said Gaussian function is selected from the group consisting of:
two-dimensional Gaussian functions and three-dimensional Gaussian functions.

8. The method according to claim 1, wherein said specified histogram is selected from the group consisting of:
uniform histograms, linearly-rising histograms, tissue contrast enhancement histograms, tissue class accentuation histograms and combinations thereof.

9. The method according to claim 1, wherein said histogram is generated from said digital image.

10. An imaging device comprising:
a memory, said memory containing image data acquired of an object;
a processor, said processor processing said image data, a histogram being generated from a portion of said image data,
wherein said processor transforms at least one pixel in said image data by minimizing error between said histogram and a specified histogram.

11. The imaging device according to claim 10, wherein said processor transforms said at least one pixel by weighting each pixel according to a weighting function.

12. The imaging device according to claim 10, wherein said processor in transforming:
modifies said at least one pixel;
computes a weighting vector by minimizing the error between said histogram and said specified histogram; and
corrects said at least one pixel using said weighting vector.

13. The imaging device according to claim 12, wherein said weighting vector (W) is described by the formula:

$$W = B^{-1} Z.$$

14. The imaging device according to claim 13, wherein matrix B and vector Z are described by the formulas:

$$B = \begin{bmatrix} \sum_{i=1}^{N} P_i^2 b_{1i}^2 & \sum_{i=1}^{N} P_i^2 b_{1i} b_{2i} & \cdots & \sum_{i=1}^{N} P_i^2 b_{1i} b_{Mi} \\ \sum_{i=1}^{N} P_i^2 b_{1i} b_{2i} & \sum_{i=1}^{N} P_i^2 b_{2i}^2 & \cdots & \sum_{i=1}^{N} P_i^2 b_{2i} b_{Mi} \\ \vdots & \vdots & & \vdots \\ \sum_{i=1}^{N} P_i^2 b_{Mi} b_{1i} & \sum_{i=1}^{N} P_i^2 b_{Mi} b_{2i} & \cdots & \sum_{i=1}^{N} P_i^2 b_{Mi}^2 \end{bmatrix}$$

and $$Z = \begin{bmatrix} \sum_{i=1}^{N} s_i P_i b_{1i} \\ \sum_{i=1}^{N} s_i P_i b_{2i} \\ \vdots \\ \sum_{i=1}^{N} s_i P_i b_{Mi} \end{bmatrix}$$

where $s_i$ is the histogram-specified transformed gray level of the $i^{th}$ pixel, N is the number of pixels in the image, $P_i$ is the original gray level of the $i^{th}$ pixel, $b_{ji}$ is the interpolation coefficient of the $j^{th}$ grid point acting on the $i^{th}$ pixel, $W_j$ is the weight value of the $j^{th}$ interpolating function, and M is the number of points in the grid.

15. The imaging device according to claim 10, wherein a plurality of grid points overlay an image portion of said object, each said grid point having associated therewith at least one interpolating function.

16. The imaging device according to claim 15, wherein said at least one interpolating function is selected from the group consisting of:
Gaussian functions and multiquadratic basis functions.

17. The imaging device according to claim 16, wherein said Gaussian function is selected from the group consisting of:
two-dimensional Gaussian functions and three-dimensional Gaussian functions.

18. The imaging device according to claim 10, wherein said specified histogram is selected from the group consisting of:
uniform histograms, linearly-rising histograms, tissue contrast enhancement histograms, tissue accentuation histograms and combinations thereof.

19. The imaging device of claim 10, wherein said histogram is generated from a digital image of said object.

20. A computer-generated image, said image comprising:
on a computer display, a plurality of pixels in an image portion of said image,
wherein said plurality of pixels have image intensity inhomogeneity therein; and
wherein at least one pixel in said plurality of pixels is transformed by minimizing error between a histogram generated from said plurality of pixels and a specified histogram.

21. The computer-generated image according to claim 20, wherein a plurality of grid points overlay said image portion, each said grid point having associated therewith at least one interpolating function.

22. The computer-generated image according to claim 20, wherein said at least one pixel is transformed by weighting said at least one pixel according to a weighing function, and
wherein said weighting vector (W) is described by the formula:

$$W = B^{-1} Z.$$

23. The computer-generated image according to claim 22, wherein matrix B and vector Z are described by the formulas:

$$B = \begin{bmatrix} \sum_{i=1}^{N} P_i^2 b_{1i}^2 & \sum_{i=1}^{N} P_i^2 b_{1i} b_{2i} & \cdots & \sum_{i=1}^{N} P_i^2 b_{1i} b_{Mi} \\ \sum_{i=1}^{N} P_i^2 b_{1i} b_{2i} & \sum_{i=1}^{N} P_i^2 b_{2i}^2 & \cdots & \sum_{i=1}^{N} P_i^2 b_{2i} b_{Mi} \\ \vdots & \vdots & & \vdots \\ \sum_{i=1}^{N} P_i^2 b_{Mi} b_{1i} & \sum_{i=1}^{N} P_i^2 b_{Mi} b_{2i} & \cdots & \sum_{i=1}^{N} P_i^2 b_{Mi}^2 \end{bmatrix}$$

and $$Z = \begin{bmatrix} \sum_{i=1}^{N} s_i P_i b_{1i} \\ \sum_{i=1}^{N} s_i P_i b_{2i} \\ \vdots \\ \sum_{i=1}^{N} s_i P_i b_{Mi} \end{bmatrix}$$

where $s_i$ is the histogram-specified transformed gray level of the $i^{th}$ pixel, N is the number of pixels in the image, $P_i$ is the original gray level of the $i^{th}$ pixel, $b_{ji}$ is the interpolation coefficient of the $j^{th}$ grid point acting on the $i^{th}$ pixel, $W_j$ is the weight value of the $j^{th}$ interpolating function, and M is the number of points in the grid.

24. A magnetic resonance imaging apparatus comprising:
   a memory, said memory containing magnetic resonance imaging data acquired of an object;
   a processor, said processor processing said image data, a histogram being generated from a portion of said image data,
   wherein said processor transforms at least one pixel in said image data by minimizing error between said histogram and a specified histogram.

25. The magnetic resonance imaging apparatus according to claim 24, wherein said processor transforms image pixel information by weighting each pixel according to a weighting function.

26. The magnetic resonance imaging apparatus according to claim 24, wherein a plurality of grid points overlay an image portion of said object, each said grid point having associated therewith at least one interpolating function.

27. The magnetic resonance imaging apparatus according to claim 26, wherein said at least one interpolating function is selected from the group consisting of:
   two-dimensional Gaussian functions, three-dimensional Gaussian functions and multiquadratic basis functions, and
   wherein said specified histogram is selected from the group consisting of:
   uniform histograms, linearly-rising histograms, tissue contrast enhancement histograms, tissue accentuation histograms and combinations thereof.

* * * * *